(12) United States Patent
Lee

(10) Patent No.: US 9,281,058 B2
(45) Date of Patent: Mar. 8, 2016

(54) SEMICONDUCTOR MEMORY DEVICE AND A READING METHOD THEREOF

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/518,852

(22) Filed: Oct. 20, 2014

(65) Prior Publication Data

US 2015/0325306 A1    Nov. 12, 2015

(30) Foreign Application Priority Data

May 7, 2014    (KR) ........................ 10-2014-0054206

(51) Int. Cl.
| | |
|---|---|
| G11C 11/56 | (2006.01) |
| G11C 16/28 | (2006.01) |
| G11C 16/04 | (2006.01) |
| G11C 16/30 | (2006.01) |
| G11C 16/06 | (2006.01) |

(52) U.S. Cl.
CPC ........ *G11C 11/5628* (2013.01); *G11C 16/0483* (2013.01); *G11C 16/28* (2013.01); *G11C 16/30* (2013.01); *G11C 16/06* (2013.01)

(58) Field of Classification Search
CPC ............... G11C 11/5628; G11C 16/28; G11C 16/0483; G11C 16/30; G11C 16/06
See application file for complete search history.

(56) References Cited

U.S. PATENT DOCUMENTS

| | | | |
|---|---|---|---|
| 8,355,283 B2 | 1/2013 | Roohparvar et al. | |
| 2011/0305081 A1* | 12/2011 | Lee | 365/185.03 |
| 2012/0243342 A1* | 9/2012 | Lee et al. | 365/189.05 |
| 2013/0155773 A1* | 6/2013 | Miyamoto | 365/185.12 |
| 2014/0036599 A1* | 2/2014 | Mun | 365/185.22 |

FOREIGN PATENT DOCUMENTS

KR    1020100044802    4/2010

* cited by examiner

*Primary Examiner* — Richard Elms
*Assistant Examiner* — Ajay Ojha
(74) *Attorney, Agent, or Firm* — IP & T Group LLP

(57) ABSTRACT

A semiconductor memory device may include a common source line controller configured to provide a channel current to a cell string via a common source line during a read operation and a page buffer configured to detect data stored in a selected memory cell by detecting a current of the bit line when the channel current is provided. The page buffer may selectively bias the bit line to maintain a voltage of the bit line to be the same as or higher than a reference voltage.

19 Claims, 14 Drawing Sheets

SEMICONDUCTOR MEMORY DEVICE AND A READING METHOD THEREOF

CROSS-REFERENCE TO RELATED APPLICATION

The present application claims priority to Korean Patent Application Number 10-2014-0054206, filed on May 7, 2014, the entire disclosure of which is incorporated herein in its entirety by reference.

BACKGROUND

1. Field of Invention

Various exemplary embodiments of the present invention relate generally to an electronic device, and more particularly, to a semiconductor memory device and a reading method thereof.

2. Description of Related Art

Semiconductor memory devices are memory devices implemented by using semiconductors such as silicon (Si), germanium (Ge), gallium arsenide (GaAs), indium phosphide (InP), etc. Semiconductor memory devices may be divided into volatile memory devices and nonvolatile memory devices.

Volatile memory devices lose their data when their power supply is removed and examples include a static random access memory (SRAM), a dynamic random access memory (DRAM), a synchronous dynamic random access memory (SDRAM), etc. Nonvolatile memory devices retain their data when their power supply is removed. Nonvolatile memory devices include a read only memory (ROM), a programmable ROM (PROM), an erasable PROM (EPROM), electrically EPROM (EEPROM), a phase-change RAM (PRAM), a magnetoresistive RAM (MRAM), a resistive RAM (RRAM), ferroelectric RAM (FRAM), a flash memory, etc.

When the semiconductor memory device performs a read operation, data of memory cells coupled to a selected word line may be determined as current flows to a common source line through bit lines. That is, depending on whether the current of the bit line is released to the common source line or not, the data of the corresponding memory cell may be determined. When the read operation is performed, however, a large current may flow to the common source line, which may unintentionally increase the voltage of the common source line and reduce reliability of the read operation.

SUMMARY

Various exemplary embodiments of the present invention are directed to a semiconductor device including a plurality of processors and a method of operating the same.

In an embodiment, a semiconductor memory device may include a cell string including a plurality of memory cells coupled in series between a common source line and a bit line, a common source line controller suitable for providing a channel current to the cell string via the common source line in a read operation, and a page buffer suitable for detecting data stored in a memory cell selected from the plurality of memory cells by detecting a current of the bit line when the channel current is provided, wherein the page buffer selectively biases the bit line to maintain a voltage of the bit line to be the same or higher than a reference voltage.

In an embodiment, the page buffer may include current passages coupled to the bit line and supplies a reference current to the bit line via at least one of the current passages when the voltage of the bit line is lower than the reference voltage.

In an embodiment, when the reference current is supplied, the voltage of the bit line may be maintained as the reference voltage.

In an embodiment, the page buffer may include current passages coupled to the bit line and release a current of the bit line via at least one of the current passages when the voltage of the bit line is higher than the reference voltage.

In an embodiment, the page buffer may include a sensing node, and detect the data stored in the selected memory cell depending on whether a voltage of the sensing node is higher or lower than a comparison voltage. The current of the bit line may be reflected in the voltage of the sensing node.

In an embodiment, a power source having a lower voltage level than the comparison voltage may be electrically coupled to the bit line during the read operation, thereby maintaining the voltage of the bit line to be the same as or higher than the reference voltage.

In an embodiment, the reference voltage may be lower than the comparison voltage.

In an embodiment, the page buffer may provide a path to release the channel current when the channel current is transferred to the bit line and provide a reference current to the bit line when the channel current is blocked.

In an embodiment, the reference voltage may be lower than a first voltage, the bit line having the first voltage when the channel current is transferred to the bit line.

In an embodiment, the page buffer may include at least one transistor which provides a current passage between the power source and the bit line when the channel current is blocked. The power source may have a second voltage lower than the first voltage.

In an embodiment, during the read operation, a gate voltage which is lower than the first voltage and higher than the second voltage may be applied to a gate of at least one transistor.

In an embodiment, the at least one transistor may provide the reference current to the bit line from the power source when the voltage of the bit line is lower than the reference voltage as the channel current is blocked based on the data of the selected memory cell.

Another embodiment of the present invention may provide a method for reading of a semiconductor memory device including a plurality of memory cells coupled in series between a common source line and a bit line. The method for reading of the semiconductor memory device may include selectively transferring a channel current to the bit line from the common source line based on a threshold voltage of a memory cell selected from the plurality of memory cells during a read operation, reflecting a current of the bit line in a voltage of a sensing node, and determining data of the selected memory cell depending on whether the voltage of the sensing node is higher or lower than a comparison voltage, wherein a voltage of the bit line is maintained to be the same as or higher than a reference voltage as a power source having a lower voltage level than the comparison voltage that is electrically coupled to the bit line.

In an embodiment, the reference voltage may be lower than the comparison voltage.

In an embodiment, the selectively transferring of the channel current to the bit line may include providing a reference current from the power source to the bit line when the channel current is blocked based on the threshold voltage of the selected memory cell.

In an embodiment, the voltage of the bit line may be maintained as the reference voltage when the reference current is provided.

In an embodiment, the selectively transferring of the channel current to the bit line may include releasing the channel current to the power source when the channel current is transferred from the common source line to the bit line.

In an embodiment, when the channel current is transferred to the bit line, the voltage of the sensing node may be higher than the comparison voltage.

Another embodiment of the present invention may provide a method of operating a semiconductor memory device including a plurality of memory cells coupled in series between a common source line and a bit line, the method including selectively transferring a channel current to the bit line from the common source line based on a threshold voltage of a memory cell selected from the plurality of memory cells, reflecting a current of the bit line in a voltage of a sensing node, determining data of the selected memory cell depending on whether the voltage of the sensing node is higher or lower than a comparison voltage, and maintaining a voltage of the bit line to be the same as or higher than a reference voltage using a power source having a lower voltage level than the comparison voltage.

In an embodiment, the maintaining of the voltage of the bit line may include providing a reference current from the power source to the bit line when the channel current is blocked in the selectively transferring of the channel current, and releasing the channel current to the power source when the channel current is transferred in the selectively transferring of the channel current.

The foregoing summary is illustrative only and is not intended to be limiting in any way. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
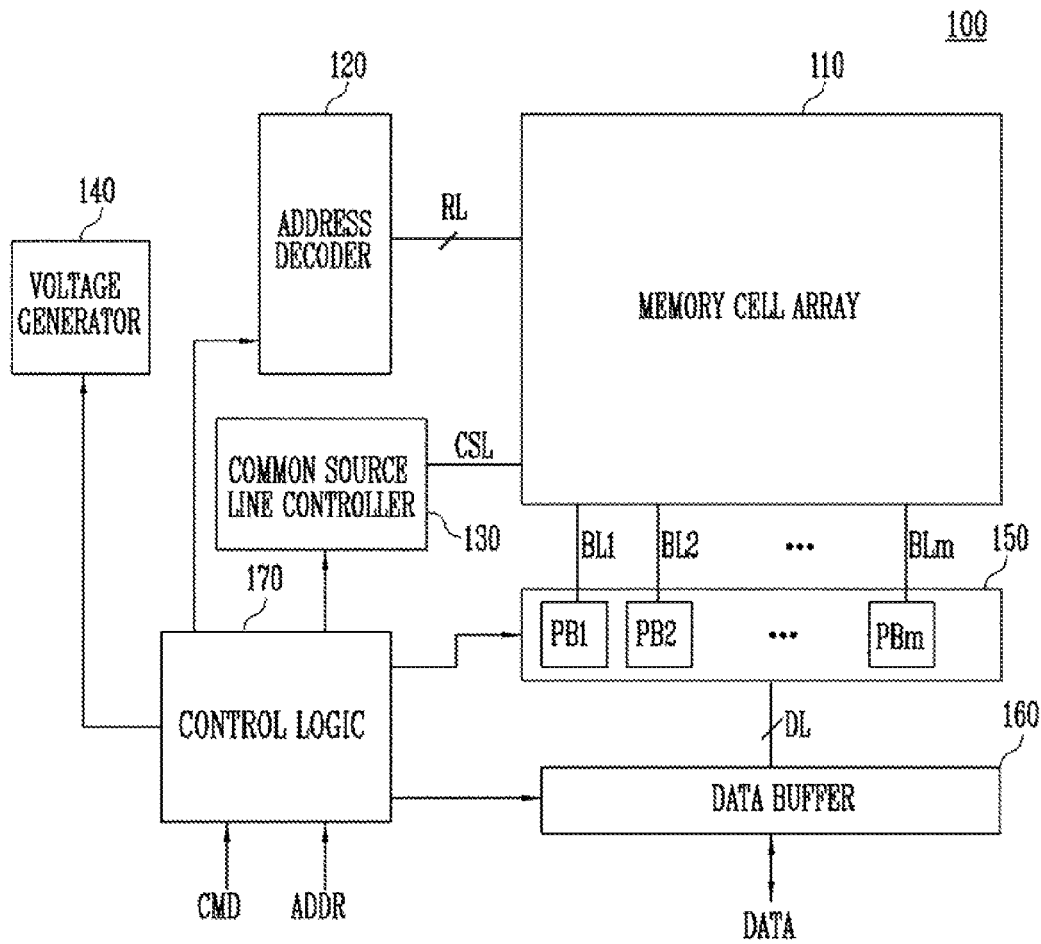
FIG. 1 is a block diagram illustrating a semiconductor memory device.

Hereinafter, the most preferable embodiment of the present invention will be described with reference to the accompanying drawings. In the drawings, thicknesses and lengths of elements may be exaggerated to simplify the illustrations. In describing the present invention, configurations, structures, and methods that are commonly known to those skilled in the art may be omitted to avoid obscuring the present invention. Throughout the drawings, like reference numerals refer to like elements.

The figures are provided to allow those having ordinary skill in the art to understand the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In this specification, a singular form may include a plural form as long as it is not specifically mentioned. Furthermore, 'include/comprise' or 'including/comprising' used in the specification represents that one or more components, steps, operations, and elements may exist or be added.

FIG. 1 is a block diagram illustrating a semiconductor memory device 100.

Referring to FIG. 1, the semiconductor memory device 100 may include a memory cell array 110, an address decoder 120, a common source line controller 130, a voltage generator 140, a read and write circuit 150, a data buffer 160 and a control logic 170.

The memory cell array 110 may be coupled to the address decoder 120 via row lines RL and may be coupled to the common source line controller 130 via a common source line CSL. The memory cell array 110 may be coupled to the read and write circuit 150 via bit lines BL1 to BLm.

The memory cell array 110 may include a plurality of memory blocks. Each of the plurality of memory blocks may include a plurality of cell strings.

In an embodiment, each of the plurality of cell strings may include a plurality of memory cells stacked above a substrate. The plurality of memory cells may be non-volatile memory cells. In an embodiment, each of the plurality of memory cells may be defined as a single level cell or a multi level cell. Further details on the memory cell array 110 will be described in reference to FIGS. 2 to 4.

The address decoder 120 may be coupled to the memory cell array 110 via the row lines RL. The row lines RL may include drain select lines, word lines and source select lines. In an embodiment, the row lines RL may further include pipe select lines.

The address decoder 120 may operate in response to control of the control logic 170. The address decoder 120 may be configured to receive an address ADDR from the control logic 170 and drive the row lines RL based on the received address ADDR.

In an embodiment, during a read operation, the address ADDR may include a block address and a row address. The address decoder 120 may be configured to decode the block address from the received address ADDR. The address decoder 120 may select one memory block based on a decoded block address. The address decoder 120 may be configured to decode the row address among the received address ADDR. The address decoder 120 may apply a read voltage supplied from the voltage generator 140 based on a decoded row address to a selected word line of the selected one memory block. The address decoder 120 may apply a pass voltage supplied from the voltage generator 140 to non-selected word lines of the selected one memory block.

The address decoder 120 may include a block decoder, a row decoder, an address buffer, etc.

The common source line controller 130 may be configured to control the common source line CSL in response to the control of the control logic 170. The common source line controller 130 may supply a channel current to the common source line CSL during the read operation. As the channel current is supplied, the common source line CSL may have a positive voltage.

The voltage generator 140 may be configured to generate a plurality of voltages using an external voltage supplied to the semiconductor memory device 100. The voltage generator 140 may operate in response to the control of the control logic 170.

In an embodiment, the voltage generator 140 may include a circuit configured to generate a power voltage by regulating the external voltage. In an embodiment, the voltage generator 140 may include a plurality of pumping capacitors and may generate a plurality of voltages by selectively vitalizing the plurality of pumping capacitors receiving the power voltage. The plurality of voltages may be supplied to the address decoder 120, the common source line controller 130, the read and write circuit 150, the data buffer 160 and the control logic 170.

The read and write circuit 150 may be coupled to the memory cell array 110 via the bit lines BL1 to BLm. The read and write circuit 150 may operate in response to the control of the control logic 170.

The read and write circuit 150 may include first to mth page buffers 150 respectively coupled to the first to mth bit lines BL1 to BLm. During the read operation, the first to mth page buffers 150 may be configured to determine data of memory cells coupled to the selected word line (hereinafter, the "selected memory cells") by detecting current of the first to mth bit lines BL1 to BLm, respectively. The read and write circuit 150 may supply data DATA, which is read from the selected memory cells, to the data buffer 160 via data lines DL.

In an embodiment, the read and write circuit 150 may further include a row select circuit.

The data buffer 160 may be coupled to the read and write circuit 150 via the data lines DL. The data buffer 160 may operate in response to the control of the control logic 170. The data buffer 160 may output the data DATA supplied from the read and write circuit 150 to the outside.

The control logic 170 may be coupled to the address decoder 120, the common source line controller 130, the voltage generator 140, the read and write circuit 150 and the data buffer 160. The control logic 170 may be configured to control the address decoder 120, the common source line controller 130, the voltage generator 140, the read and write circuit 150 and the data buffer 160 in response to a command CMD. The control logic 170 may supply the address ADDR to the address decoder 120.

In an embodiment, the semiconductor memory device 100 may be a flash memory device.

FIG. 1 illustrates that one page buffer is provided to one bit line. However, this is for illustrative purposes only and the present invention should not be limited thereto. In an embodiment, one page buffer is supplied to every two bit lines, and a switching unit may be provided for electrically coupling any one of the two bit lines and the page buffer. For example, a semiconductor memory device may have an even-odd line structure.

Figure 2:
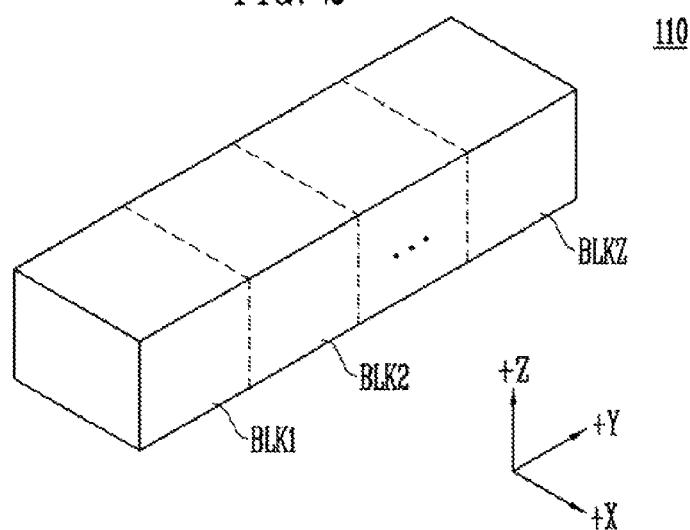
FIG. 2 is a block diagram illustrating a memory cell array shown in FIG. 1 according to an embodiment.

FIG. 2 is a block diagram illustrating a memory cell array shown in FIG. 1 according to an embodiment.

Referring to FIG. 2, the memory cell array 110 may include a plurality of memory blocks BLK1 to BLKz. Each of the memory blocks may have a three-dimensional structure. Each memory block may include a plurality of memory cells stacked on a substrate. The plurality of memory cells may be arranged in a +X direction, a +Y direction and a +Z direction. The structure for each memory block will be described in further detail in reference to FIGS. 3 and 4.

Figure 3:
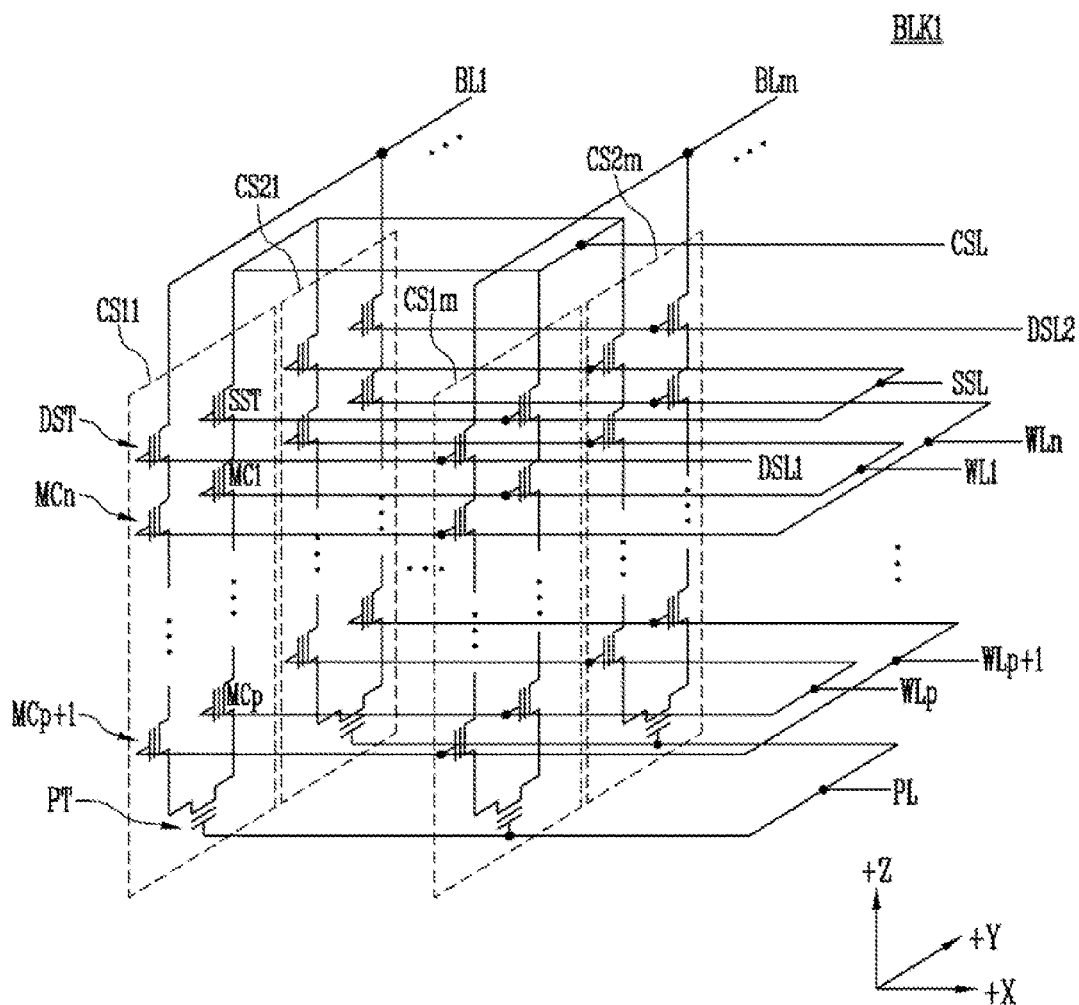
FIG. 3 is a circuit diagram illustrating any one of memory blocks shown in FIG. 2 according to an embodiment.

FIG. 3 is a circuit diagram illustrating any one of the memory blocks shown in FIG. 2 according to an embodiment.

Referring to FIG. 3, the first memory block BLK1 may include a plurality of cell strings CS11 to CS1m and CS21 to CS2m. M cell strings may be arranged in a row direction (i.e., +X direction) in the first memory block BLK1. The m cell strings arranged in the row direction may be coupled to first to mth bit lines BL1 to BLm, respectively. Q cell strings (where q is a natural number) may be arranged in a column direction (i.e., +Y direction). For convenience, only two cell strings arranged in the column direction are shown in FIG. 3.

Each of the plurality of cell strings CS11 to CS1m and CS21 to CS2m may be U-shaped. Each of the plurality of cell strings CS11 to CS1m and CS21 to CS2m may include a pipe transistor PT, memory cells MC1 to MCn, a source select transistor SST and a drain select transistor DST which are stacked above a substrate (not shown) at a lower part of the memory block BLK1.

The select transistors SST and DST and the memory cells MC1 to MCn may have a similar structure. For example, each of the select transistors SST and DST and the memory cells MC1 to MCn may include a channel layer, a tunneling insulating layer, a charge storage layer and a blocking insulating layer coupled to the corresponding row line.

The source select transistor SST of each cell string may be coupled between a common source line CSL and the memory cells MC1 to MCp. A gate of the source select transistor SST may be coupled in common to a source select line SSL.

The first to nth memory cells MC1 to MCn of each cell string may be coupled between the source select transistor SST and the drain select transistor DST.

The first to nth memory cells MC1 to MCn may be divided into first to pth memory cells MC1 to MCp and P+1th to nth memory cells MCp+1 to MCn. The first to pth memory cells MC1 to MCp may be coupled to the P+1th to nth memory cells MCp+1 to MCn via the pipe transistor PT. The first to pth memory cells MC1 to MCp may be sequentially arranged in the reverse direction of a +Z direction and may be serially coupled between the source select transistor SST and the pipe transistor PT. The p+1th to nth memory cells MCp+1 to MCn may be sequentially stacked in the +Z direction and may be serially coupled between the pipe transistor PT and the drain select transistor DST. The gates of the first to nth memory cells MC1 to MCn may be respectively coupled to the first to nth word lines WL1 to WLn.

A gate of the pipe transistor PT of each cell string may be coupled to a pipe line PL.

The drain select transistor DST of each cell string may be coupled between the corresponding bit line and the memory cells MCp+1 to MCn. The drain select transistors of the cell strings CS11 to CS1m in the first row may be coupled to a first drain select line DSL1. The drain select transistors DST of the cell strings CS21 to CS2m in the second row may be coupled to a second drain select line DSL2.

The cell strings arranged in the same row (+X direction) (e.g., CS11 to CS1m) may be coupled to the same drain select line (e.g., DSL1) via the corresponding drain select transistors. The cell strings arranged in different rows (e.g., CS11 and CS21) may be coupled to different drain select lines DSL1 and DSL2).

Figure 4:
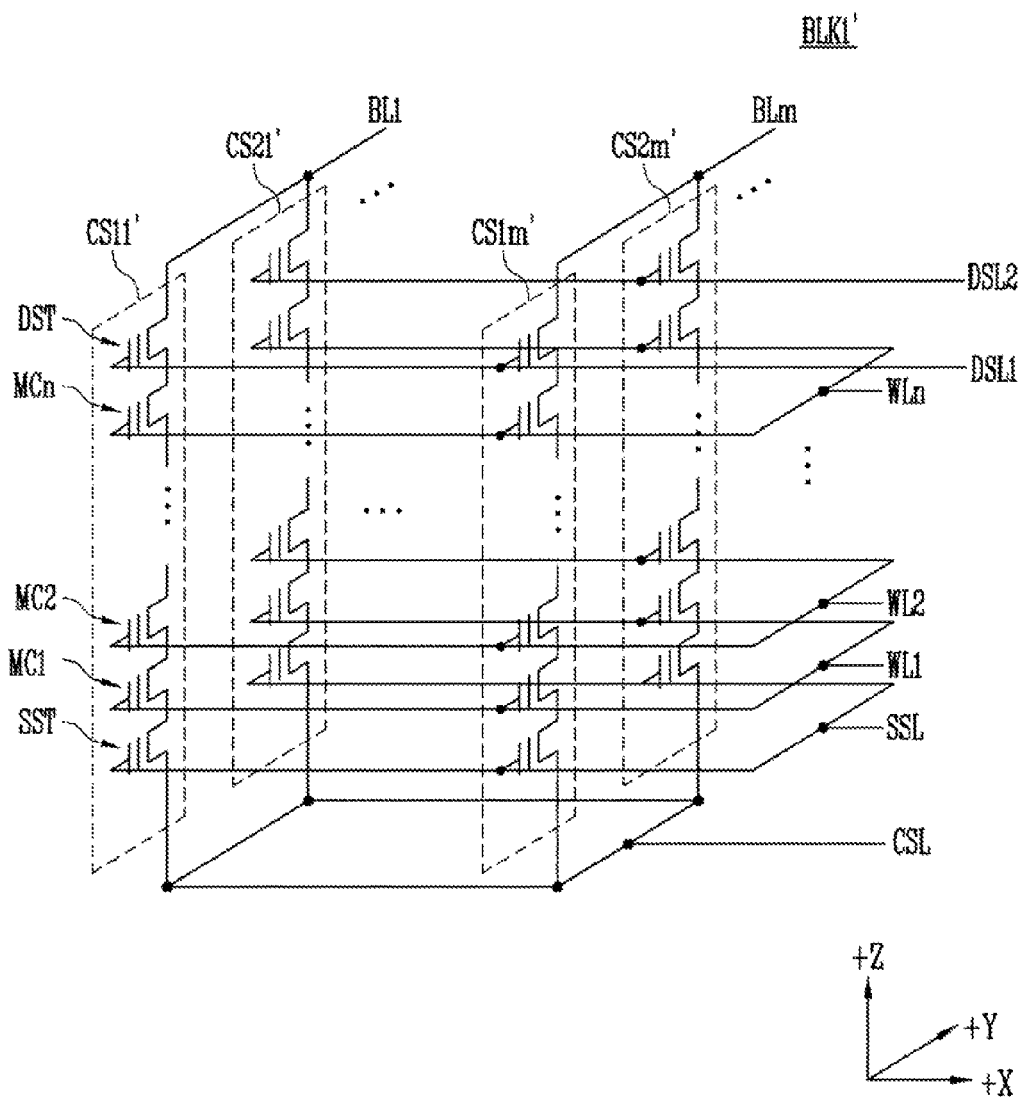
FIG. 4 is a circuit diagram illustrating any one of memory blocks shown in FIG. 2 according to another embodiment.

FIG. 4 is a circuit diagram illustrating any one memory block BLK1 of memory blocks BLK1 to BLKz shown in FIG. 2 as a memory block BLK1' according to another embodiment.

Referring to FIG. 4, the first memory block BLK1' may include a plurality of cell strings CS11' to CS1m' and CS21' to CS2m'. M cell strings may be arranged in a row direction (i.e., +X direction) in the first memory block BLK1'. The m cell strings arranged in the row direction may be respectively coupled to first to mth bit lines BL1 to BLm. Q cell strings (where q is a natural number) may be arranged in a column direction (i.e., +Y direction). For convenience, only two cell strings arranged in the column direction are shown in FIG. 4.

Each of the plurality of cell strings CS11' to CS1m' and CS21' to CS2m' may be extended in the +Z direction. Each of the plurality of cell strings CS11' to CS1m' and CS21' to CS2m' may include a source select transistor SST, first to nth memory cells MC1 to MCn and a drain select transistor DST which are stacked over a substrate (not shown) of a lower part of the first memory block BLK1'.

The source select transistor SST of each cell string may be coupled to a common source line CSL in common. The source select transistor SST of each cell string may be coupled between the common source line CSL and the memory cells MC1 to MCn. A gate of the source select transistor SST of each cell string may be coupled to a source select line SSL.

The first to nth memory cells MC1 to MCn of each cell string may be coupled in series between the source select transistor SST and the drain select transistor. The memory cells at the same layer/level may be coupled to the same word line. The first to nth memory cells MC1 to MCn may be respectively coupled to the first to nth word lines WL1 to WLn.

The drain select transistor DST of each cell string may be coupled between a corresponding bit line and the memory cells MC1 to MCn. The drain select transistors of the cell strings arranged in the same row (+X direction) may be coupled to a same drain select line. The drain select transistors DST of the cell strings CS11' to CS1m' of a first row may be coupled to a first drain select line DSL1. The drain select transistors DST of the cell strings CS21' to CS2m' of a second row may be coupled to a second drain select line DSL2.

As a result, except for the fact that a pipe select transistor PT is excluded from each cell string, the memory block BLK1' in FIG. 4 may include an equivalent circuit similar to that of the memory block BLK1 in FIG. 3.

In FIG. 4, the first to mth cell strings CS11' to CS1m' or CS21' to CS2m' arranged in the row direction may be respectively coupled to the first to mth bit lines BL1 to BLm. In another embodiment, even bit lines and odd bit lines may be provided instead of the first to mth bit lines BL1 to BLm. Even-numbered cell strings among the cell strings CS11' to CS1m' or CS21' to CS2m' arranged in the row direction may be respectively coupled to the even bit lines, and odd-numbered cell strings among the cell strings CS11' to CS1m' or CS21' to CS2m' arranged in the row direction may be respectively coupled to the odd bit lines.

Figure 5:
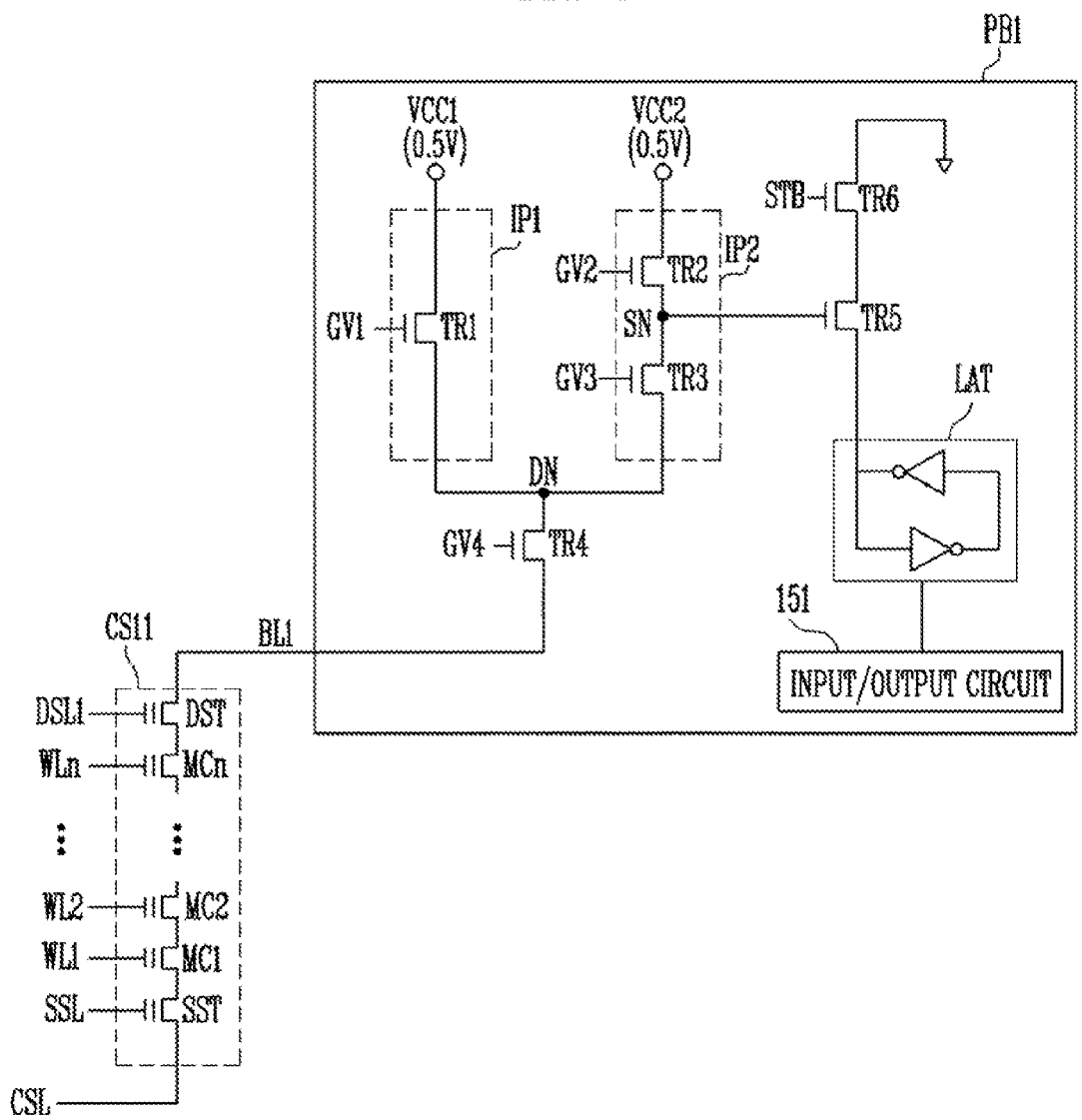
FIG. 5 is a block diagram illustrating any one of page buffers shown in FIG. 1.

FIG. 5 is a block diagram illustrating any one of page buffers PB1 to PBm shown in FIG. 1. For convenience, in FIG. 5, only a cell string CS11 among cell strings CS11 and CS21 coupled to a bit line BL1 is shown. That is, it may be described as an example that a first drain select line DSL1 is selected and a second drain select line DSL2 is unselected.

Referring to FIG. 5, the page buffer PB1 may include a first current passage IP1 having a first transistor TR1, a second current passage IP2 having second and third transistors TR2 and TR3, fourth to sixth transistors TR4 to TR6, a latch circuit LAT and an input/output circuit 151. In an embodiment, the first to sixth transistors TR1 to TR6 may be NMOS transistors.

The first current passage IP1 may be coupled between a first voltage source VCC1 and a detection node DN. The first voltage source VCC1 may have a low voltage lower than a trip point of the sixth transistor TR6. The first transistor TR1 included in the first current passage IP1 may operate in response to a first gate voltage GV1.

The second current passage IP2 may be coupled between a second voltage source VCC2 and the detection node DN. The second voltage source VCC2 may have a low voltage lower than the trip point of the sixth transistor TR6. The second transistor TR2 included in the second current passage IP2 may be coupled between the second voltage source VCC2 and a sensing node, and the third transistor TR3 included in the second current passage IP2 may be coupled between the sensing node SN and the detection node DN. The second and third transistors TR2 and TR3 may operate in response to second and third gate voltages GV2 and GV3, respectively.

The fourth transistor TR4 may be coupled between the detection node and the bit line BL1. The fourth transistor TR4 may electrically couple the first and second current passages IP1 and IP2 and the bit line BL1 in response to a fourth gate voltage GV4.

The fifth and sixth transistors TR5 and TR6 may be coupled in series between the latch circuit LAT and a ground. The fifth transistor TR5 may be coupled between the sixth transistor TR6 and the latch circuit LAT. Its gate is coupled to the sensing node SN. The sixth transistor TR6 may be coupled between the fifth transistor TR5 and the ground and may operate in response to a strobe signal STB.

Different from what is shown in FIG. 5, each of the fifth and sixth transistors TR5 and TR6 may be replaced by a PMOS transistor. The PMOS transistors may be coupled between the latch LAT and a power supply voltage.

The latch circuit LAT may include two inverters and latch data using the two inverters. The latch circuit LAT may be coupled between the fifth transistor TR5 and the input/output circuit 151. The latch circuit LAT may store corresponding data depending on whether the fifth and sixth transistors TR5 and TR6 are turned on or turned off.

The input/output circuit 151 may be coupled to the latch circuit LAT. The input/output circuit 151 may respond to the control of the control logic 170 (refer to FIG. 1) and output the data stored in the latch circuit LAT to the data buffer 160 (refer to FIG. 1).

During a read operation, the common source line controller 130 (refer to FIG. 1) may provide a channel current to a cell string CS11 via a common source line CSL.

Voltages may be applied to a source select line SSL and a selected drain select line DSL1 such that a source select transistor SST and a drain select transistor DST are turned on. A low voltage may be applied to an unselected drain select line DSL2 (refer to FIG. 3).

A read voltage may be applied to a word line (e.g., WL2) selected from word lines WL1 to WLn. A pass voltage which is a high voltage may be applied to unselected word lines WL1 and WL3 to WLn from the word lines WL1 to WLn. By the pass voltage of the high voltage, memory cells MC1 and MC3 to MCn coupled to the unselected word lines WL1 and WL3 to WLn may be turned on regardless of their threshold voltages. By the read voltage, a selected memory cell MC2 may be turned on or off depending on its threshold voltage. If the threshold voltage of the selected memory cell MC2 is higher than the read voltage, the selected memory cell C2 may be turned off. If the threshold voltage of the selected memory cell MC2 is lower than the read voltage, the selected memory cell MC2 may be turned on. Depending on whether the selected memory cell MC2 is turned on, a channel current provided to the cell string CS11 via the common source line CSL may flow to the bit line BL1.

The first to fourth transistors TR1 to TR4 may be turned on when the read operation is performed. Therefore, the first and second current passages IP1 and IP2 may electrically couple the bit line BL1 with the first and second voltage sources VCC1 and VCC2.

The page buffer PB1 may store data of the selected memory cell MC2 in the latch circuit LAT by sorting data of the selected memory cell MC2 depending on whether the channel current flows to the bit line BL1 or the channel current is blocked.

The current of the bit line BL1 may be reflected as the voltage of the sensing node SN.

When the channel current flows to the bit line BL1, the voltage of the sensing node SN may increase. When the voltage of the sensing node SN is higher than a comparison voltage, i.e., the trip point of the fifth transistor TR5, the fifth transistor TF5 may be turned on. When the strobe signal STB is enabled and the sixth transistor TR6 is turned on, the latch circuit LAT may be electrically coupled to the ground and may store a logic value '0', for example.

When the channel current does not flow to the bit line BL1, the voltage of the sensing node SN may not increase. The voltage of the sensing node SN may be lower than the comparison voltage. Accordingly, the fifth transistor TR5 may be turned off. Therefore, even if the sixth transistor TR6 is turned on as the strobe signal STB is enabled, the latch circuit LAT may not be coupled to the ground. The latch circuit LAT may store an initial data, for example, a logic value '1'.

The page buffer PB1 may detect the current of the bit line BL1 and store the data stored in the selected memory cell MC2 in the latch circuit LAT.

In an embodiment, the bit line BL1 may be selectively biased such that the voltage of the bit line BL1 is the same as or higher than a reference voltage. The page buffer PB1 may maintain the voltage of the bit line BL1 the same as or higher than the reference voltage by electrically coupling the voltage sources VCC1 and VCC2 having a lower voltage level than the comparison voltage to the bit line BL1 via the current passages IP1 and IP2. The reference voltage may be lower than the trip point of the fifth transistor TR5, i.e., the comparison voltage. The reference voltage may be lower than voltages of the voltage sources VCC1 and VCC2.

When the voltage of the bit line BL1 is the same as or lower than the reference voltage, that is, when the channel current does not flow to the bit line BL1, a reference current may be provided to the bit line BL1 via at least one of the first and second current passages IP1 and IP2. Accordingly, the voltage of the bit line BL1 may be maintained as the reference voltage.

When the voltage of the bit line B11 is higher than the reference voltage, that is, when the channel current flows to the bit line BL1, the channel current may be released via at least one of the first and second current passages IP1 and IP2. The channel current provided via the common source line CSL may be dispersed via the bit lines BL1 to BLm, and the common source line CSL may have no bounce in its current or voltage level.

Figure 6:
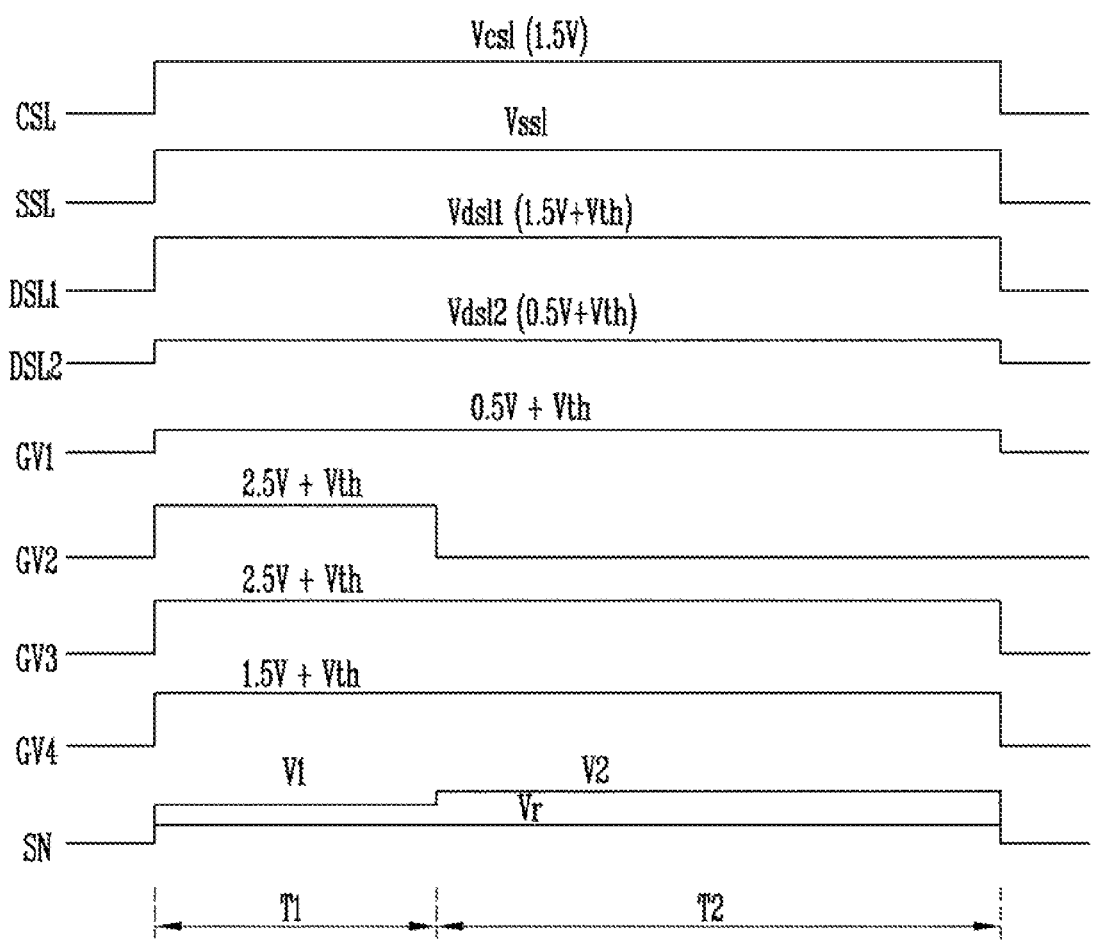
FIG. 6 is a timing chart illustrating a read operation of a page buffer shown in FIG. 5 according to an embodiment.

FIG. 6 is a timing chart illustrating a read operation of a page buffer PB1 according to an embodiment.

Referring to FIGS. 5 and 6, a channel current of a common source line CSL may be transferred to a bit line BL based on a threshold voltage of a selected memory cell during a first time T1.

A common source line voltage Vcsl may be applied to the common source line CSL. For example, the common source line voltage Vcsl may be 1.5V. Accordingly, the channel current may be provided via the common source line CSL.

A source select line voltage Vssl may be applied to the source select line SSL. Accordingly, a source select transistor SST may be turned on. A first drain select line voltage Vds11 may be applied to a selected drain select line DSL1. As the first drain select line voltage Vds11 is applied, a drain select transistor DST which is coupled to the selected drain select line DSL1 may be turned on. For example, the first drain select line voltage Vds11 may be 1.5V+Vth (Vth is a threshold voltage of the corresponding transistor). The drain select transistor DST coupled to the selected drain select line DSL1 may transfer the channel current to the bit line BL1. A second drain select line voltage Vdsl2 may be applied to an unselected drain select line DSL2. The second drain select line voltage Vdsl2 may be lower than the first drain select line voltage Vds11. For example, the second drain select line voltage Vdsl2 may be 0.5V+Vth. Accordingly, the drain select transistor DST coupled to the unselected drain select line DSL2 may not transfer the channel current to the bit line BL1.

A first gate voltage GV1 may increase. The first gate voltage GV1 may be configured to slightly turn on a first transistor TR1. In an embodiment, the first gate voltage GV1 may be configured to adjust how much the first transistor TR1 may be turned on based on a voltage of a detection node DN. For example, the first gate voltage GV1 may be configured to be a value which is the sum of a voltage of a first voltage source VCC1 (for example, 0.5V) and Vth. When the voltage of the detection node DN is lower than the first gate voltage GV1, a reference current may be provided from the first voltage source VCC1 via the first transistor TR1. When the voltage of the detection node DN is higher than the first gate voltage GV1, no current may be released or only a small amount of current may be released from the detection node DN via the first transistor TR1.

Second and third gate voltages GV2 and GV3 may increase. The second and third gate voltages GV2 and GV3 may be configured to fully turn on second and third transistors TR2 and TR3. For example, the second and third gate voltages GV2 and GV3 may be 2.5V+Vth.

A fourth gate voltage GV4 may increase. A fourth transistor TR4 may be turned on by a fourth gate voltage GV4. The bit line BL and the first and second current passages IP1 and IP2 may be electrically coupled.

When the selected memory cell is in an erase state, the threshold voltage of the selected memory cell may be lower than a read voltage applied to the selected word line (e.g., WL2). The selected memory cell may be turned on, and the channel current of the common source line CSL may be transferred to the bit line BL1 via the cell string CS11. The bit line BL1 may have a specified voltage, for example, 1.5V.

Second to fourth transistors TR2 to TR4 may be turned on. Therefore, the channel current transferred to the bit line BL1 may flow to a second voltage source VCC2 via second to fourth transistors TR2 to TR4. A voltage of a sensing node SN may increase to a first voltage V1 based on the channel current.

When the selected memory cell is in a program state, the threshold voltage of the selected memory cell may be higher than the read voltage applied to the selected word line. The selected memory cell may be turned off, and the channel current provided to the common source line CSL may be blocked by the selected memory cell. That is, the channel current of the common source line CSL may not be transferred to the bit line BL1.

The second to fourth transistors TR2 to TR4 may be turned on. The bit line BL1 may be electrically coupled to the second voltage source VCC2. The voltage of the bit line BL1 may decrease based on the fact that the channel current is not provided to the bit line BL1. The reference current may be provided to the bit line BL1 from the second voltage source VCC2. When the voltage of the bit line BL1 is lower than a reference voltage, the reference current may be provided from the page buffer PB1. As the reference current is provided, the bit line BL1 may maintain the reference voltage Vr. The sensing node SN may maintain the reference voltage Vr based on the reference current.

Since the second voltage source VCC2 may be a low voltage, for example, 0.5V, the reference voltage Vr may be lower than the first voltage V1. In an embodiment, a voltage of the second voltage source VCC2 may be configured such that the reference voltage Vr is lower than a trip point of a fifth transistor TR5. Therefore, even if the reference voltage Vr is higher than the ground, the fifth transistor TR5 may not be turned on.

The drain select transistor DST and unselected memory cells (e.g., MC3 to MCn) between the selected memory cell (e.g., MC2) and the drain select transistor DST may be turned on. Therefore, the reference current provided to the bit line BL1 may be transferred to a channel of unselected memory cells MC3 to MCn between the drain select transistor DST and the selected memory cell MC2. Consequentially, the channel of the unselected memory cells MC3 to MCn between the selected memory cell MC2 and the drain select transistor DST may have the reference voltage Vr.

When the channel voltage of the unselected memory cells is the ground, the difference between a pass voltage of a high voltage applied to the unselected word lines and the channel voltage may be relatively large. As a result, threshold voltages of the unselected memory cells may increase unintentionally.

When the channel voltage is the reference voltage Vr as shown in the embodiment, the difference between the pass voltage of a high voltage applied to the unselected word lines and the channel voltage may be relatively small. As such, the unintentional increase in the threshold voltages of the unselected memory cells may be avoided.

During a time T2, the current of the bit line BL1 may be reflected as the voltage of the sensing node SN.

The second gate voltage GV2 may be deactivated. The second transistor TR2 may be turned off. When the selected memory cell is in the erase state, the channel current which is transferred to the bit line BL1 may not be released to the second voltage source VCC2. As a result, the voltage of the sensing node SN may increase to the second voltage V2.

When the selected memory cell is in the program state, the channel current may not be transferred to the bit line BL1. Since the second transistor TR2 is turned off, the sensing node SN and the detection node DN may be electrically disconnected from the second voltage source VCC2. When the voltage of the detection node DN decreases further from the reference voltage Vr, the reference current may flow in from the first voltage source VCC1. The voltage of the detection node DN and the sensing node SN may be maintained as the reference voltage Vr. Since the fourth transistor TR4 is turned on, the bit line BL1 may receive the reference current from the first voltage source VCC1. The bit line BL1 may maintain the reference voltage Vr.

When the sensing node SN has the second voltage V2, the fifth transistor TR5 may be turned on. When a sixth transistor TR6 is turned on as a strobe signal STB is enabled, a latch circuit LAT may store corresponding data. When the sensing node SN has the reference voltage Vr, the fifth transistor TR5 may be turned off. The latch circuit LAT may maintain initial data.

Figure 7:
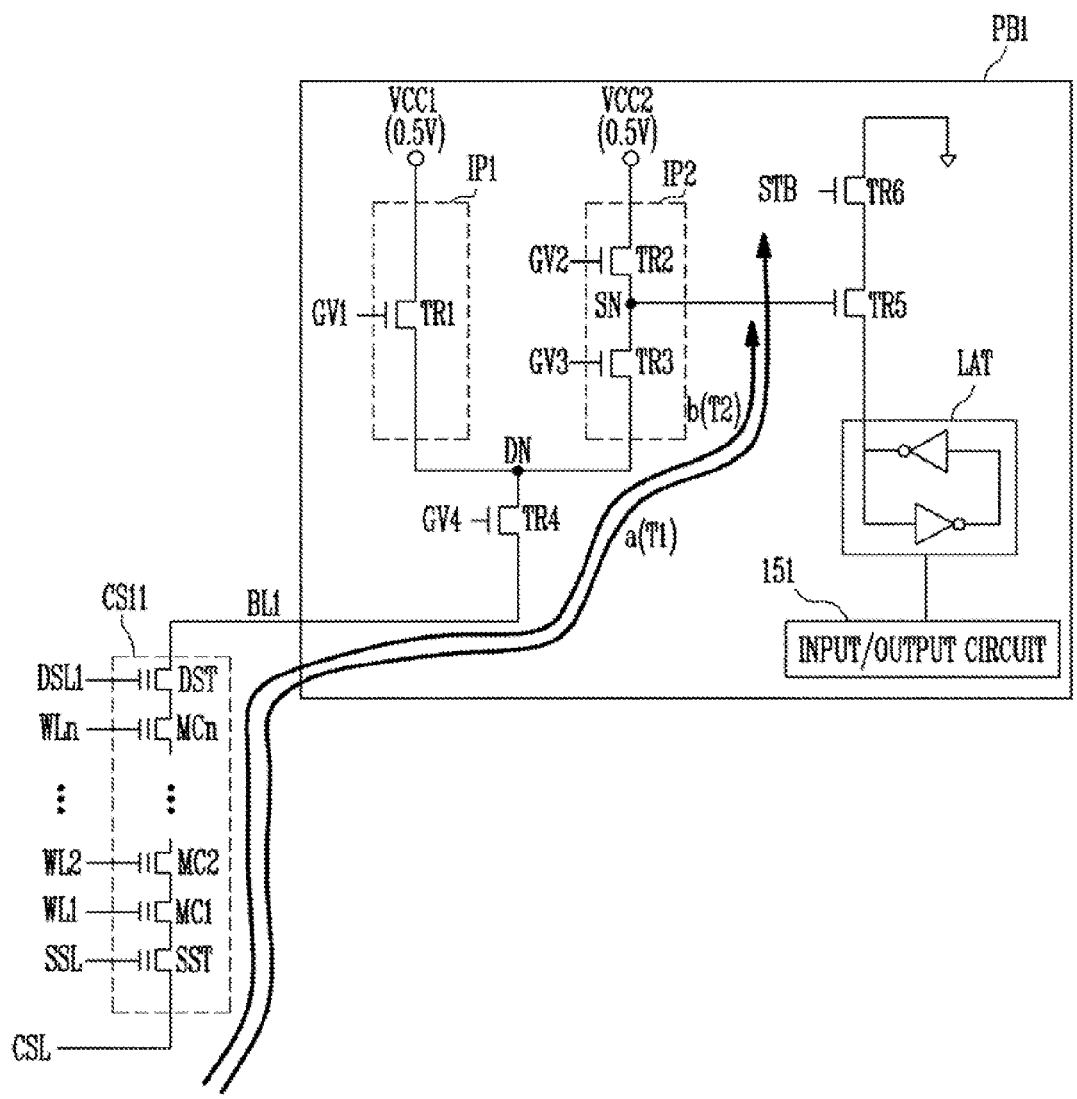
FIG. 7 illustrates the flow of a current in the page buffer according to an embodiment in FIG. 6 when a selected memory cell is in an erase state.

FIG. 7 illustrates the flow of current in the page buffer PB1 according to an embodiment in FIG. 6 when the selected memory cell is in an erase state.

Referring to FIGS. 6 and 7, a channel current provided from a common source line CSL may be transferred to a bit line BL1. The channel current transferred to the bit line BL1 may be released to a second voltage source VCC2 (a) since second to fourth transistors TR2 to TR4 are turned on in a first time T1.

When a second transistor TR2 is turned off in a second time T2, the channel current of the bit line BL1 may not be released to the second voltage source VCC2 (b). Due to a voltage of a detection node DN which has become high, a source terminal of the first transistor TR1 may be a first voltage source VCC1. A gate-source voltage of the first transistor TR1 may be 0. A small amount of current may be released or not released from the detection node DN to the first voltages source VCC1.

Figure 8:
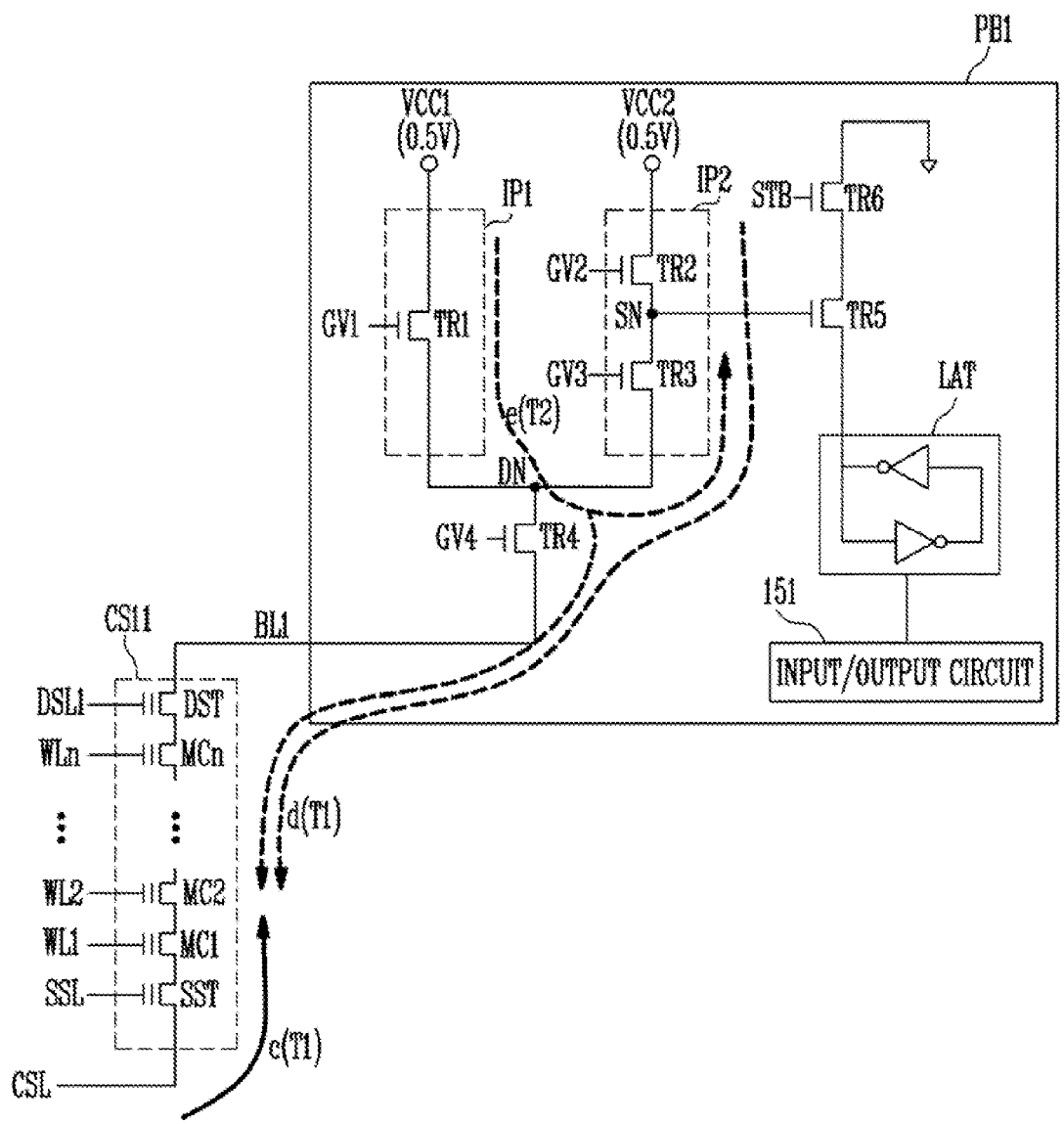
FIG. 8 illustrates the flow of current in the page buffer according to an embodiment in FIG. 6 when the selected memory cell is in a program state.

FIG. 8 illustrates the flow of current in the page buffer PB1 according to an embodiment in FIG. 6 when a selected memory cell is in a program state.

Referring to FIGS. 6 and 8, a channel current provided from a common source line CSL may be blocked by a selected memory cell (e.g., MC2 (c)). In a first time T1, second to fourth transistors TR2 to TR4 are turned on, and since the channel current is not supplied to a bit line BL1, a reference current may flow to the bit line BL1 from a second voltage source VCC2. A reference voltage may be transferred to near the selected memory cell of a cell string CS11 (d). The reference current is shown as a dotted line in FIG. 8.

Though not shown in FIG. 8, when voltages of a detection node DN and a bit line BL1 are lower than the reference voltage Vr, a first transistor TR1 may be turned on, and the reference current may be provided from a first voltage source VCC1 via the first transistor TR1.

When the second transistor TR2 is turned off in a second time T2, the reference current may not be provided from a second voltage source VCC2. Since the first transistor TR1 is still turned on, the reference current may be provided to the bit line BL1 from the first voltage source VCC1 (e). Since a third transistor TR3 is still turned on, the reference current from the first voltage source VCC1 may be transferred to the sensing node SN (e).

Figure 9:
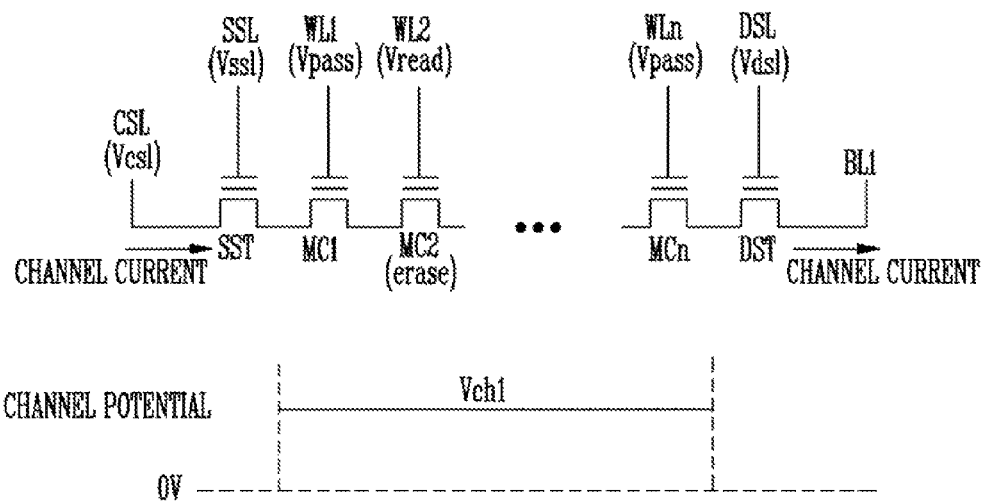
FIG. 9 is a conceptual diagram illustrating a channel potential of memory cells when the selected memory cell is in the erase state.
Figure 10:
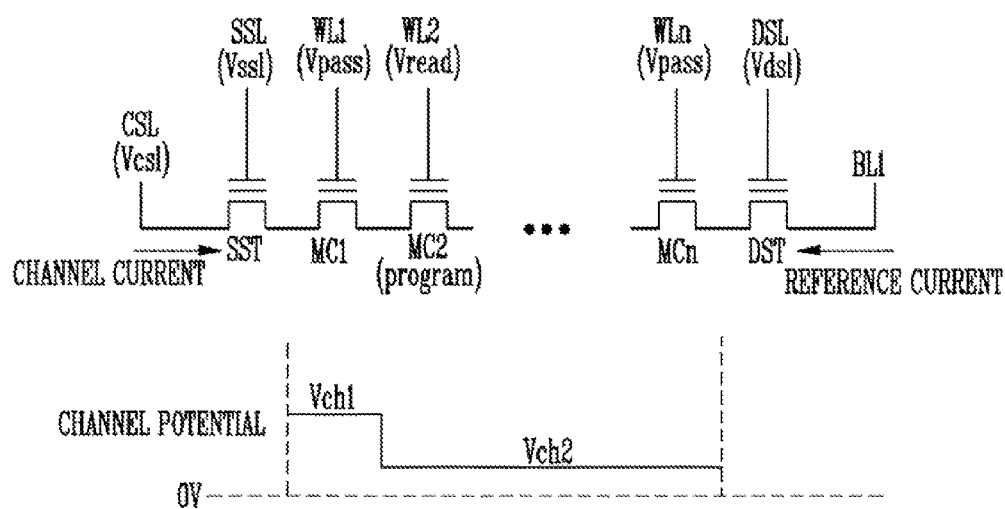
FIG. 10 is a conceptual diagram illustrating the channel potential of memory cells when the selected memory cell is in the program state.

FIG. 9 is a conceptual diagram illustrating a channel potential of memory cells MC1 to MCn when the selected memory cell is in the erase state. Referring to FIGS. 9 and 10, it will be described as an example that the second memory cell MC2 is selected.

Referring to FIG. 9, a selected memory cell MC2 and unselected memory cells MC1, MC3 to MCn are turned on. Therefore, a channel current from a common source line CSL may be transferred to the memory cells MC1 to MCn. A channel of the memory cell MC1 to MCn may have a first channel voltage Vch1 based on the channel current. For example, the first channel voltage Vch1 may be the same as a common source line voltage Vcsl.

The channel current may be released through at least one of first and second current passages IP1 and IP2. The channel current provided via the common source line CSL may be dispersed through bit lines BL1 to BLm, and the common source line CSL may have no bounce in its current or voltage level.

FIG. 10 is a conceptual diagram illustrating the channel potential of memory cells MC1 to MCn when the selected memory cell MC2 is in the program state.

Referring to FIG. 10, the channel current from the common source line CSL may be provided to a channel of the unselected memory cell MC1. Based on the channel current, the channel of the memory cell MC1 may have the first channel voltage Vch1. For example, the first channel voltage Vch1 may be the same as the common source line voltage Vcsl.

The channel current of the common source line CSL may not be provided to the channel of the unselected memory cells MC3 to MCn between the selected memory cell MC2 and the drain select transistor DST. The reference current may be provided via the bit line BL1. The channel of the unselected memory cells MC3 to MCn may have a second channel voltage Vch2 based on the reference current. The second channel voltage Vch2 may have a positive voltage that is lower than the first channel voltage Vch1. Therefore, the disturbance caused by the difference between a pass voltage Vpass applied to the unselected word lines WL3 to WLn and the channel voltage may be effectively prevented. For example, the second channel voltage Vch2 may be the same as the reference voltage.

A second drain select line voltage Vdsl2 which is a low voltage may be applied to the unselected drain select line DSL2 (refer to FIG. 3). For example, 0.5V+Vth may be applied to the second drain select line DSL2. Since the drain select transistor DST coupled to the unselected drain select line DSL2 may be weakly turned on, the reference current may be applied to cell strings coupled to the unselected drain select line DSL2. Therefore, the channel voltage of the cell strings coupled to the unselected drain select line DSL2 may be maintained the same or higher than the reference voltage.

Figure 11:
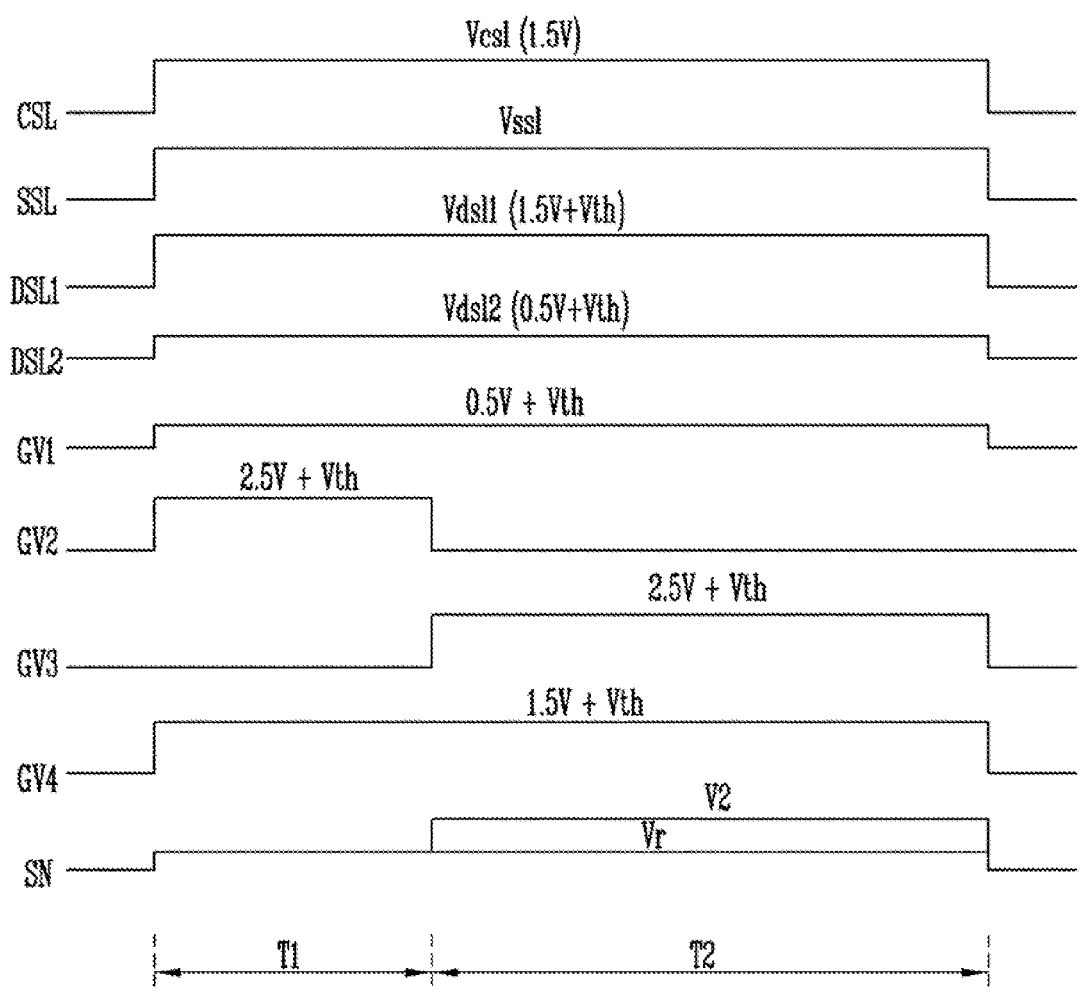
FIG. 11 is a timing chart illustrating a read operation of a page buffer shown in FIG. 5 according to another embodiment.

FIG. 11 is a timing chart illustrating the read operation of the page buffer BP1 according to another embodiment. The embodiment of FIG. 11 is the same as FIG. 6 except for a third gate voltage GV3 and a voltage of a sensing node SN. Any previously given description will be omitted.

Referring to FIGS. 5 and 11, the third gate voltage GV3 may be deactivated in a first time T1. A third transistor TR3 may be turned off. The bit line BL1 may be electrically disconnected from the sensing node SN as the third transistor TR3 is turned off. The sensing node SN may increase to a reference voltage Vr due to a second voltage source VCC2 regardless of data of a selected memory cell.

A current of the bit line BL1 in a second time T2 may be reflected as a voltage of the sensing node SN. The third gate voltage GV3 may increase, and accordingly, the third transistor TR3 may be turned on. The bit line BL1 and the sensing node SN may be electrically coupled to each other.

When a selected memory cell is in an erase state, the sensing node SN may increase to the second voltage V2 as it receives the channel current. When the selected memory cell is in a program state, the sensing node SN may not receive the channel current. Since the sensing node SN receives the reference current as it is electrically coupled to the first voltage source VCC1, the voltage of the sensing node SN may be maintained as the reference voltage Vr.

Figure 12:
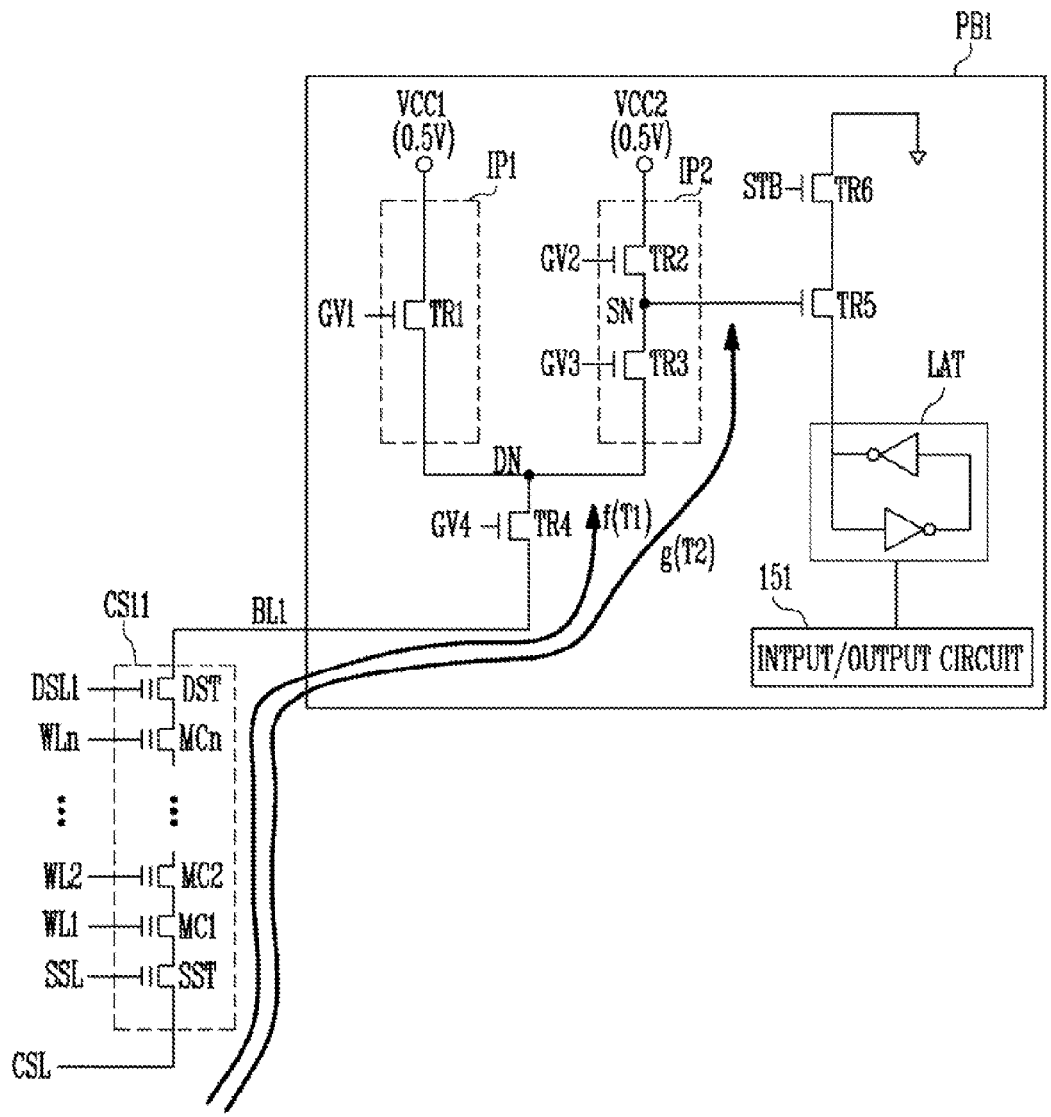
FIG. 12 illustrates the flow of current in the page buffer according to an embodiment shown in FIG. 11 when the selected memory cell is in the erase state.

FIG. 12 illustrates the flow of a current in the page buffer BP1 according to an embodiment shown in FIG. 11 when the selected memory cell is in the erase state.

Referring to FIGS. 11 and 12, the channel current may be transferred to the bit line BL1 from the common source line CSL. The third transistor TR3 may be turned off in the first time T1. The channel current may not be released to the second voltage source VCC2 (f).

When the third transistor TR3 is turned on and the second transistor TR2 is turned off in the second time T2, the channel current of the bit line Bl1 may reach the sensing node SN (g).

Figure 13:
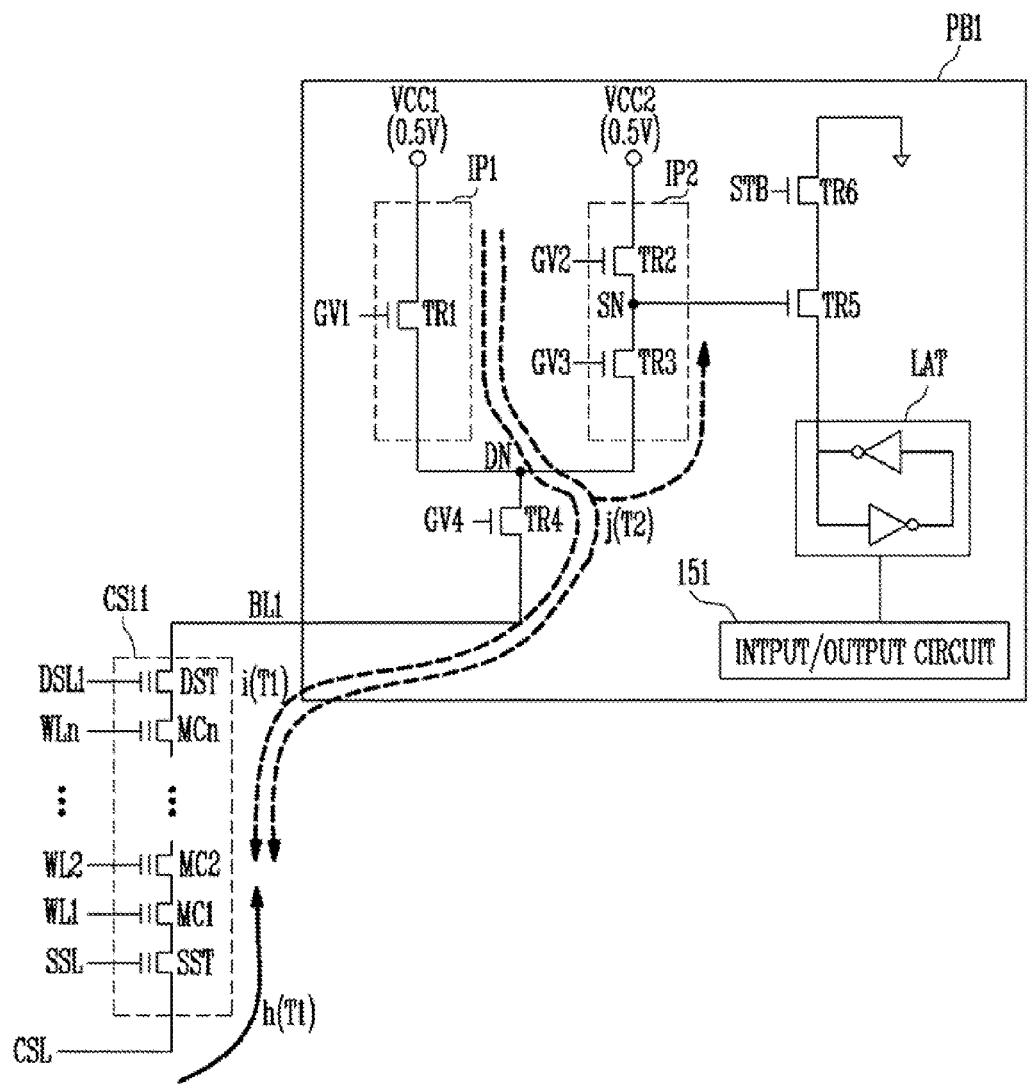
FIG. 13 illustrates the flow of current in the page buffer according to an embodiment shown in FIG. 11 when the selected memory cell is in the program state.

FIG. 13 illustrates the flow of current in the page buffer BP1 according to an embodiment shown in FIG. 11 when the selected memory cell is in the program state.

Referring to FIGS. 11 and 13, the channel current provided from a common source line CSL may be blocked by a selected memory cell (e.g., MC2) (h). Since a voltage of a detection node DN is reduced, a first transistor TR1 may be turned on in a first time T1. A third transistor TR3 may be turned off. A reference current may flow to a bit line BL1 from a first voltage source VCC1. The reference current may be transferred to a channel of unselected memory cells (e.g., MC3 to MCn) (i).

When the third transistor T3 may be turned on and a second transistor TR2 is turned off, in a second time T2, the reference current from the first voltage source VC1 may be provided to a sensing node SN (j).

According to an embodiment in FIG. 11, the reference current may be supplied to the bit line BL1 from the first voltage source VCC1.

Figure 14:
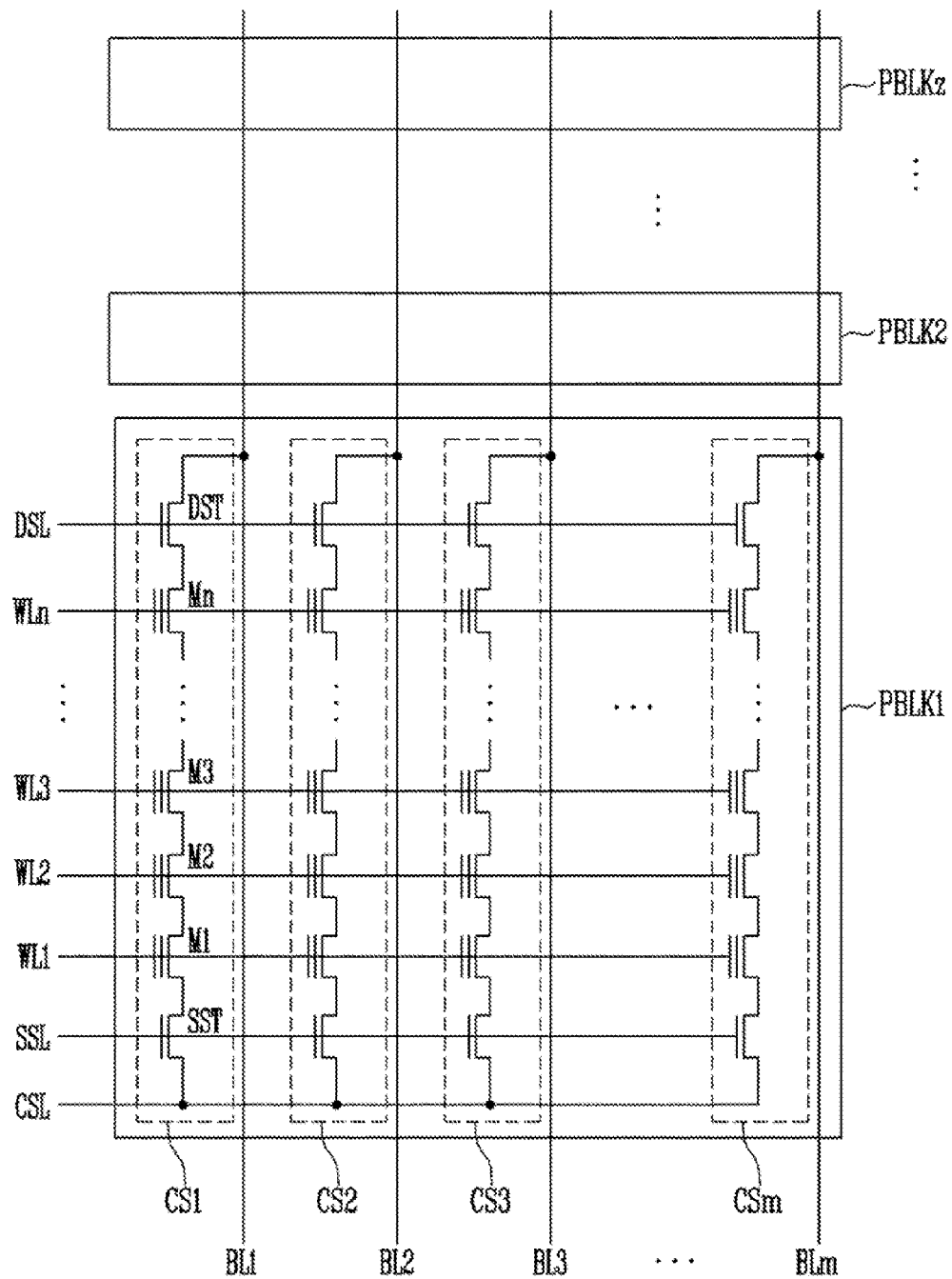
FIG. 14 is a block diagram illustrating the memory cell array shown in FIG. 1 according to another embodiment.

FIG. 14 is a block diagram illustrating a memory cell array 110 shown in FIG. 1 according to another embodiment.

The technical idea may apply even when memory cells are in 2-dimensional arrangements. Referring to FIG. 14, the memory cell array 110 may include a plurality of planar memory blocks PBLK1 to PBLKz. The plurality of planar memory blocks PBLK1 to PBLKz each may include first to mth cell strings CS1 to CSm. The first to mth cell strings CS1 to CSm may be coupled to first to mth bit lines BL1 to BLm, respectively.

Each of the plurality of cell strings CS1 to CSm may include a source select transistor SST, a plurality of memory cells M1 to Mn which are serially coupled and a drain select transistor DST. The source select transistor SST may be coupled to a source select line SSL. The first to nth memory cells M1 to Mn may be coupled to first to nth word lines WL1 to WLn, respectively. The drain select transistor DST may be coupled to a drain select line DSL. A source side of the source select transistor SST may be coupled to a common source line CSL. A drain side of the drain select transistor DST may be coupled to a corresponding bit line. Row lines RL in FIG. 1 may include the source select line SSL, the first to nth word lines WL1 to WLn and the drain select line DSL. The source select line SSL, the first to nth word lines WL1 to WLn and the drain select line DSL may be driven by an address decoder 120 in FIG. 1. The common source line CSL may be driven by a common source line controller 130 in FIG. 1.

In an embodiment, the memory cells M1 to Mn may be nonvolatile memory cells.

Figure 15:
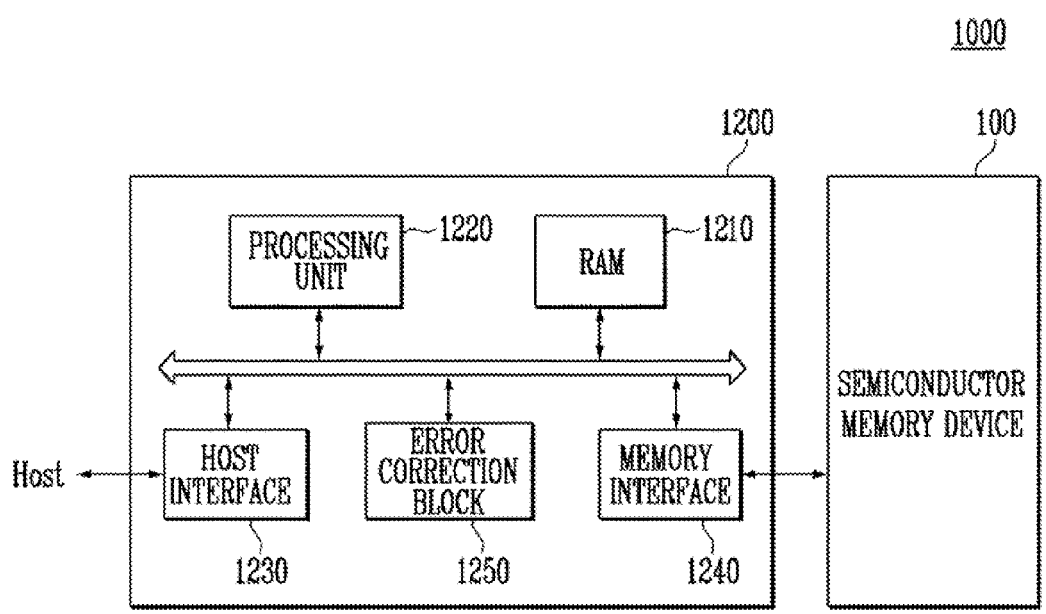
FIG. 15 is a block diagram illustrating a memory system including a semiconductor memory device shown in FIG. 1.

FIG. 15 is a block diagram illustrating a memory system 1000 including a semiconductor memory device 100 shown in FIG. 1.

Referring to FIG. 15, the memory system 1000 may include the semiconductor memory device 100 and a controller 1200.

The semiconductor memory device 100 may be configured and may operate similar to what is described in reference to FIGS. 1 to 14. Hereinafter, repeated descriptions will be omitted.

A controller 1200 may be coupled to a host Host and the semiconductor memory device 100. The controller 1200 may be configured to access the semiconductor memory device 100 at the request of the host Host. For example, the controller 1200 may be configured to control read, write, erase and background operations of the semiconductor memory device 100. The controller 1200 may be configured to provide an interface between the semiconductor memory device 100 and the host Host. The controller 1200 may be configured to drive firmware to control the semiconductor memory device 100.

The controller 1200 may include a random access memory (RAM) 1210, a processing unit 1220, a host interface 1230, a memory interface 1240 and an error correction block 1250. The RAM 1210 may be used as at least one of an operating memory of the processing unit 1220, a cache memory between the semiconductor memory device 100 and the host Host and a buffer memory between the semiconductor memory device 100 and the host Host. The processing unit 1220 may control all operations of the controller 1200.

The host interface 1230 may include a protocol for performing data exchange between the host Host and the controller 1200. In an embodiment, the controller 1200 may be configured to communicate with the host Host using at least one of various interface protocols such as a universal serial bus (USB) protocol, a peripheral component interconnection-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

A memory interface 1240 may interface with the semiconductor memory device 100. For example, the memory interface 1240 may include a NAND interface or a NOR interface.

The error correction block 1250 may be configured to detect errors in data received from the semiconductor memory device 100 and correct the error using an error correcting code (ECC).

The controller 1200 and the semiconductor memory device 100 may be integrated into one semiconductor device. For example, the controller 1200 and the semiconductor memory device 100 may be integrated into one semiconductor device to make up a memory card such as a personal computer memory card international association (PCMCIA) card, a compact flash (CF) card, a smart media card (SM or SMC), a memory stick, a multimedia card (MMC, RS-MMC, MMC-micro), a SD card (SD, miniSD, microSD, SDHC), a universal flash memory device (UFS), etc.

The controller 1200 and the semiconductor memory device 100 may be integrated into one semiconductor device and configured to make up a solid state drive (SSD). The SSD may include a storage device configured to store data in a semiconductor memory device. If the memory system 1000 is used as the SSD, the operating speed of the host Host coupled to the memory system 1000 will be enhanced.

The memory system 1000 may be used as a component of an electronic device, where examples of such electronic devices include, but are not limited to, a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, a computer network, and a telematics network, an RFID device, and at least one of various components for configuring a computing system.

In an embodiment, the semiconductor memory device 100 or the memory system 1000 may be mounted as a package of various forms. For example, the semiconductor memory device 100 or the memory system 1000 may be mounted in a package such as package on package (PoP), ball grid array (BGA), chip scale package (CSP), plastic leaded chip carrier (PLCC), plastic dual in line package (PDIP), die in waffle pack, die in wafer form, chip on board (COB), ceramic dual in line package (CERDIP), plastic metric quad flat package (MQFP), thin quad flat package (TQFP), small outline integrated circuit (SOIC), shrink small outline package (SSOP), thin small outline package (TSOP), system in package (SIP), multi ship package (MCP), wafer-level fabricated package (WFP), wafer-level processed stack package (WSP), etc.

Figure 16:
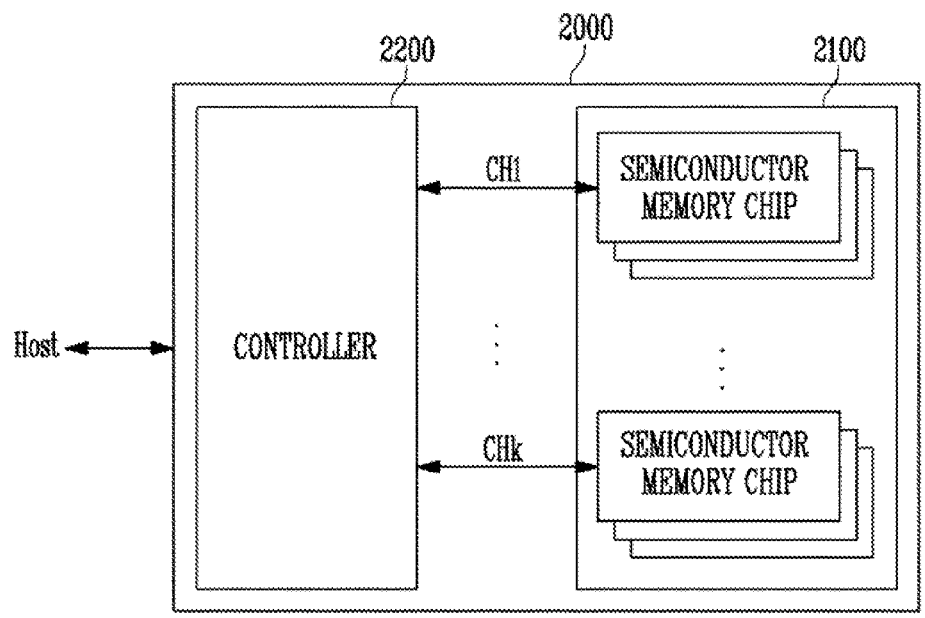
FIG. 16 is a block diagram illustrating an example of an application of a memory system shown in FIG. 15.

FIG. 16 is a block diagram illustrating an example of an application 2000 of the memory system 1000 shown in FIG. 15.

Referring to FIG. 16, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 16, the plurality of groups are shown to communicate with the controller 2200 via first to k channels CH1 to CHk. Each of the semiconductor memory chips may be configured to operate similar to the semiconductor memory device 100 described in reference to FIG. 1.

Each group may be configured to communicate with the controller 2200 through one common channel. The controller 2200 may be configured similar to the controller 1200 described in reference to FIG. 15 and may be configured to control a plurality of memory chips of the semiconductor memory device 2100 through the plurality of channels CH1 to CHk.

In FIG. 16, it is described that the plurality of semiconductor memory chips are coupled to one channel. However, it should be understood by a person of ordinary skill in the art that the memory system 2000 may be modified such that one semiconductor memory chip may be coupled to one channel.

Figure 17:
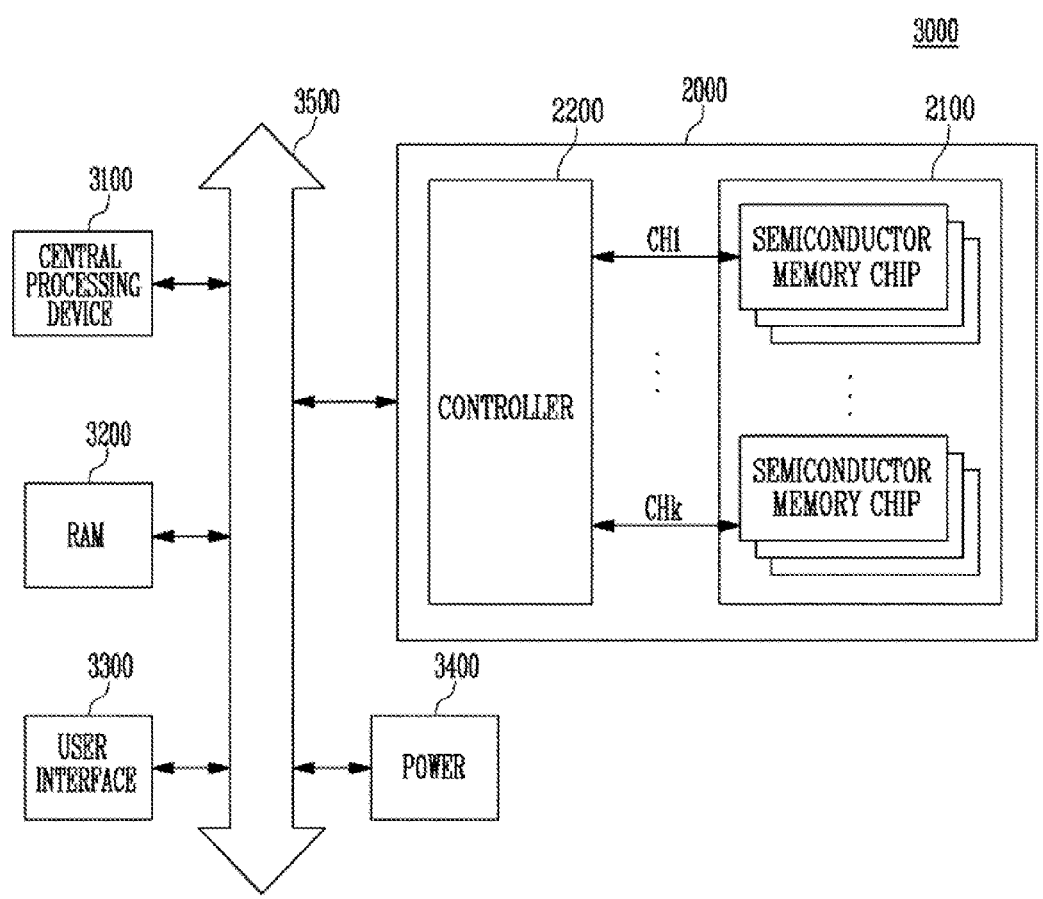
FIG. 17 is a block diagram illustrating a computing system including a memory system described in reference to FIG. 16.

FIG. 17 is a block diagram illustrating a computing system 3000 including a memory system 2000 described in reference to FIG. 16.

Referring to FIG. 17, the computing system 3000 may include a central processing device 3100, a RAM 3200, a user interface 3300, a power 3400, a system bus 3500 and a memory system 2000.

The memory system 2000 may be electrically coupled to the central processing device 3100, the RAM 3200, the user interface 3300 and the power 3400 via the system bus 3500. Data which is provided through the user interface 3300 or processed by the central processing device 3100 may be stored in the memory system 2000.

In FIG. 17, the semiconductor memory device 2100 is shown to be coupled to the system bus 3500 through the controller 2200. However, the semiconductor memory device 2100 may be configured to be directly coupled to the system bus 3500. The function of the controller 2200 may be performed by the central processing device 3100 and the RAM 3200.

FIG. 17 shows the memory system 2000 described in reference to FIG. 16. However, the memory system 2000 may be replaced by the memory system 1000 described in reference to FIG. 15. In an embodiment, the computing system 3000 may include all of the memory systems 1000 and 2000 described in reference to FIGS. 15 and 16.

Embodiments have been disclosed in the drawings and the specification. The specific terms used are for the purpose of illustration and do not limit the scope of the present invention, which is defined by the claims. Accordingly, those skilled in the art will appreciate that various modifications and other equivalent examples may be made without departing from the scope and spirit of the present disclosure. Therefore, the sole scope of technical protection of the present invention is defined by the technical spirit of the accompanying claims.

What is claimed is:

1. A semiconductor memory device, comprising:
a cell string including a plurality of memory cells coupled in series between a common source line and a bit line;
a common source line controller suitable for providing a channel current to the cell string via the common source line during a read operation; and
a page buffer suitable for detecting data stored in a memory cell selected from the plurality of memory cells by detecting a current of the bit line when the channel current is provided,
wherein the bit line has a first voltage when the channel current flows from the common source line controller to the bit line, and
the page buffer provides a current passage between a power source and the bit line to maintain a voltage of the bit line to be the same as or higher than a reference voltage when the channel current from the common source line controller is blocked from the bit line, the reference voltage being lower than the first voltage.

2. The semiconductor memory device of claim 1, wherein the page buffer comprises current passages coupled to the bit line and supplies a reference current to the bit line via at least one of the current passages when the voltage of the bit line is lower than the reference voltage.

3. The semiconductor memory device of claim 2, wherein the voltage of the bit line is maintained as the reference voltage when the reference current is supplied.

4. The semiconductor memory device of claim 1, wherein the page buffer comprises current passages coupled to the bit line and releases a current of the bit line via at least one of the current passages when the voltage of the bit line is higher than the reference voltage.

5. The semiconductor memory device of claim 1, wherein the page buffer comprises a sensing node, and detects the data stored in the selected memory cell depending on whether a voltage of the sensing node is higher or lower than a comparison voltage,
wherein a current of the bit line is reflected in the voltage of the sensing node.

6. The semiconductor memory device of claim 5, wherein the power source having a lower voltage level than the comparison voltage is electrically coupled to the bit line during the read operation, thereby maintaining the voltage of the bit line to be the same as or higher than the reference voltage.

7. The semiconductor memory device of claim 5, wherein the reference voltage is lower than the comparison voltage.

8. The semiconductor memory device of claim 1, wherein the page buffer provides a path to release the channel current when the channel current flows to the bit line.

9. The semiconductor memory device of claim 1, wherein the page buffer comprises at least one transistor which provides the current passage between the power source and the bit line when the channel current is blocked, and wherein the power source has a second voltage lower than the first voltage.

10. The semiconductor memory device of claim 9, wherein a gate voltage which is lower than the first voltage and higher than the second voltage is applied to a gate of the at least one transistor during the read operation.

11. The semiconductor memory device of claim 9, wherein the at least one transistor provides a reference current to the bit line from the power source when the voltage of the bit line is lower than the reference voltage as the channel current is blocked based on the data of the selected memory cell.

12. A method for reading a semiconductor memory device including a plurality of memory cells coupled in series between a common source line and a bit line, comprising:
selectively flowing a channel current to the bit line from the common source line based on a threshold voltage of a memory cell selected from the plurality of memory cells during a read operation;
reflecting a current of the bit line in a voltage of a sensing node; and
determining data of the selected memory cell depending on whether the voltage of the sensing node is higher or lower than a comparison voltage,
wherein a voltage of the bit line is maintained to be the same as or higher than a reference voltage as a power source having a lower voltage level than the comparison voltage is electrically coupled to the bit line.

13. The method for reading a semiconductor memory device according to claim 12, wherein the reference voltage is lower than the comparison voltage.

14. The method for reading a semiconductor memory device according to claim 12, wherein the selectively flowing of the channel current to the bit line comprises providing a reference current from the power source to the bit line when the channel current is blocked based on the threshold voltage of the selected memory cell.

15. The method for reading a semiconductor memory device according to claim 14, wherein the voltage of the bit line is maintained as the reference voltage when the reference current is provided.

16. The method of claim 12, wherein the selectively flowing of the channel current to the bit line comprises releasing the channel current to the power source when the channel current flows from the common source line to the bit line.

17. The method of claim 16, wherein the voltage of the sensing node is higher than the comparison voltage when the channel current flows to the bit line.

18. A method for operating a semiconductor memory device including a plurality of memory cells coupled in series between a common source line and a bit line, comprising:
- selectively flowing a channel current to the bit line from the common source line based on a threshold voltage of a memory cell selected from the plurality of memory cells;
- reflecting a current of the bit line in a voltage of a sensing node;
- determining data of the selected memory cell depending on whether the voltage of the sensing node is higher or lower than a comparison voltage; and
- maintaining a voltage of the bit line to be the same as or higher than a reference voltage by electrically coupling a power source to the bit line, the power source having a lower voltage level than the comparison voltage.

19. The method of claim 18, wherein the maintaining of the voltage of the bit line comprises:
- providing a reference current from the power source to the bit line when the channel current is blocked in the selectively flowing of the channel current; and
- releasing the channel current to the power source when the channel current is flown in the selectively flowing of the channel current.

* * * * *